United States Patent
Lang et al.

(10) Patent No.: US 11,670,995 B2
(45) Date of Patent: Jun. 6, 2023

(54) METHOD AND APPARATUS FOR OPERATING A DUAL ROTOR ELECTRICAL MACHINE

(71) Applicant: Deere & Company, Moline, IL (US)

(72) Inventors: Matthias Lang, Mannheim (DE); Chris J. Tremel, West Fargo, ND (US); Christopher Reek, Moline, IL (US)

(73) Assignee: Deere & Company, Moline, IL (US)

( * ) Notice: Subject to any disclaimer, the term of this patent is extended or adjusted under 35 U.S.C. 154(b) by 351 days.

(21) Appl. No.: 17/001,905

(22) Filed: Aug. 25, 2020

(65) Prior Publication Data

US 2021/0242761 A1    Aug. 5, 2021

Related U.S. Application Data

(60) Provisional application No. 62/968,624, filed on Jan. 31, 2020.

(51) Int. Cl.
*H02K 16/02*       (2006.01)
*H02K 11/21*       (2016.01)
(Continued)

(52) U.S. Cl.
CPC ........... *H02K 16/02* (2013.01); *G01D 5/2291* (2013.01); *G01R 29/0814* (2013.01);
(Continued)

(58) Field of Classification Search
CPC .. G01D 5/2291; G01R 29/0814; H02K 11/00; H02K 11/21; H02K 16/00;
(Continued)

(56) References Cited

U.S. PATENT DOCUMENTS 7,466,053 B1    12/2008  Radev
10,385,946 B2    8/2019  Lang et al.
(Continued)

FOREIGN PATENT DOCUMENTS

DE    102017206413 A1    12/2017
DE    102017209246 A1    12/2017
(Continued)

OTHER PUBLICATIONS

Sun Le et al: "Analysis and Control of Complementary Magnetic-Geared Dual-Rotor Motor", IEEE Transactions on Industrial Electronics, IEEE Service Center, Piscataway, NJ, USA, vol. 63, No. 11, Nov. 1, 2016 (Nov. 1, 2016), pp. 6715-6725 (Year: 2016).*
(Continued)

*Primary Examiner* — Rashad H Johnson
(74) *Attorney, Agent, or Firm* — Harness, Dickey & Pierce, P.L.C.

(57) ABSTRACT

There is provided a system including a dual rotor electrical machine. The dual rotor electrical machine comprises a stator, an inner rotor including a first number of permanent magnet pole pairs, and a modulator including a second number of modulating segments. The system includes a controller configured to execute non-transitory machine readable instructions that, when executed by the controller, cause the system to determine a virtual position of an electromagnetic field of the stator based on a weighted sum of an angular position of the inner rotor and an angular position of the modulator, wherein weights in the weighted sum are based on the first number and the second number.

20 Claims, 11 Drawing Sheets

(51) Int. Cl.
*G01D 5/22* (2006.01)
*G01R 29/08* (2006.01)
*H02K 21/14* (2006.01)
*H02P 6/16* (2016.01)
*H02P 23/14* (2006.01)

(52) U.S. Cl.
CPC ............. *H02K 11/21* (2016.01); *H02K 21/14* (2013.01); *H02P 6/16* (2013.01); *H02P 23/14* (2013.01)

(58) Field of Classification Search
CPC .......... H02K 16/02; H02K 21/14; H02P 6/16; H02P 23/14
USPC ............................................. 310/71, 112, 114
See application file for complete search history.

(56) References Cited

U.S. PATENT DOCUMENTS

| | | | |
|---|---|---|---|
| 10,578,194 | B2 | 3/2020 | Lang et al. |
| 2018/0278139 | A1* | 9/2018 | Kimoto ............... H02K 49/106 |
| 2019/0136953 | A1 | 5/2019 | Lang et al. |
| 2019/0190413 | A1* | 6/2019 | Ueno .................... H02K 11/30 |
| 2019/0225079 | A1 | 7/2019 | Lang et al. |
| 2019/0289771 | A1 | 9/2019 | Lang et al. |
| 2019/0356206 | A1* | 11/2019 | Frampton ................ F16H 1/46 |
| 2021/0175785 | A1* | 6/2021 | Deng .................... H02K 1/146 |

FOREIGN PATENT DOCUMENTS

| | | |
|---|---|---|
| DE | 102017208985 A1 | 11/2018 |
| DE | 102017219758 A1 | 5/2019 |
| DE | 102018200953 A1 | 7/2019 |
| DE | 102018204405 A1 | 9/2019 |
| DE | 102018212143 A1 | 1/2020 |
| EP | 3410587 A1 | 12/2018 |
| EP | 3410588 A1 | 12/2018 |
| EP | 3480493 A1 | 5/2019 |
| EP | 3513997 A1 | 7/2019 |
| EP | 3543058 A1 | 9/2019 |
| EP | 3255761 B1 | 7/2020 |

OTHER PUBLICATIONS

Sun Le et al: "Motion Control and Performance Evaluation of a Magnetic-Geared Dual-Rotor Motor in Hybrid Powertrain", IEEE Transactions on Industrial Electronics, IEEE Service Center, Piscataway, Nd, USA, vol. 64, No. 3, Mar. 1, 2017 (Mar. 1, 2017), pp. 1863-1872 (Year: 2017).*

Extended European Search Report and Written Opinion issued in European Patent Application No. 20214636.1, dated Jun. 1, 2021, in 08 pages.

Sun Le et al, Analysis and control of Complementary Magnetic-Geared Dual-Rotor Motor, IEEE Transactions on Industrial Electronics, IEEE Service Center, Retrieved from the Internet <URL: https://ieeexplore.ieee.org/document/7493601>, Nov. 1, 2016, pp. 6715-6725, 10.1109/TIE.2016.2581768.

Sun Le et al, Motion Control and Performance Evaluation of a Magnetic-Geared Dual-Rotor Motor in Hybrid Powertrain, IEEE Transactions on Industrial Electronics, IEEE Service Center, Retrieved from the Internet <URL: https://ieeexplore.ieee.org/document/7740097/metrics#metrics>, Mar. 1, 2017, pp. 1863-1872, 10.1109/TIE.2016.2627018.

Nekkalapu Sameer, et al. "Design and Optimization of Dual Rotor Motor For Electric Vehicle Application," IEEE International Conference on Power Electronics, Drives and Energy Systems (PEDES), pp. 1-5, 2014.

* cited by examiner

METHOD AND APPARATUS FOR OPERATING A DUAL ROTOR ELECTRICAL MACHINE

CROSS-REFERENCE TO RELATED APPLICATIONS

This application claims priority under 35 U.S.C. 119(e) to Provisional Application No. 62/968,624 filed in the United States Patent and Trademark Office on Jan. 31, 2020, the entire contents of which are herein incorporated by reference.

BACKGROUND

Example embodiments relate, in general, to methods and apparatuses for operating electrical machines including synchronous permanent magnets.

In a dual rotor electrical machine, an inner rotor includes a number of permanent magnet pole pairs, and a modulating rotor includes a number of modulating ferromagnetic segments.

SUMMARY

Some example embodiments provide methods, apparatus, and/or computer-readable mediums for calculating stator field position(s) from inner rotor and modulator positions.

Some example embodiments enable the dual rotor electrical machine to be run in a speed mode and/or a torque mode.

Some example embodiments include methods, apparatuses, and computer-readable mediums for operating a dual rotor electrical machine.

According to some example embodiments, there is provided a system comprising a dual rotor electrical machine including a stator, an inner rotor including a first number of permanent magnet pole pairs, and a modulator including a second number of modulating segments, and a controller configured to execute non-transitory machine readable instructions that, when executed by the controller, cause the system to determine a virtual position of an electromagnetic field of the stator based on a weighted sum of an angular position of the inner rotor and an angular position of the modulator, wherein weights in the weighted sum are based on the first number and the second number.

BRIEF DESCRIPTION OF THE DRAWINGS

Example embodiments will be more clearly understood from the following detailed description taken in conjunction with the accompanying drawings. FIGS. 1-9b represent non-limiting, example embodiments as described herein.

FIG. 1 illustrates a relation between mechanical and electrical rotation positions illustrating a stepping effect;

FIG. 2 illustrates a dual rotor electrical machine, according to some example embodiments;

FIG. 3 illustrates a system for controlling a dual rotor electrical machine, according to some example embodiments;

FIG. 4 illustrates a system for controlling a dual rotor electrical machine, according to some example embodiments;

FIG. 7 illustrates a relation between mechanical and electrical rotation positions, according to some example embodiments; and FIG. 8 illustrates a method of operating a dual rotor electrical machine, according to some example embodiments.

FIGS. 9a and 9b illustrate alternate views of the dual rotor electrical machine of FIGS. 6a and 6b.

DETAILED DESCRIPTION

Figure 1:
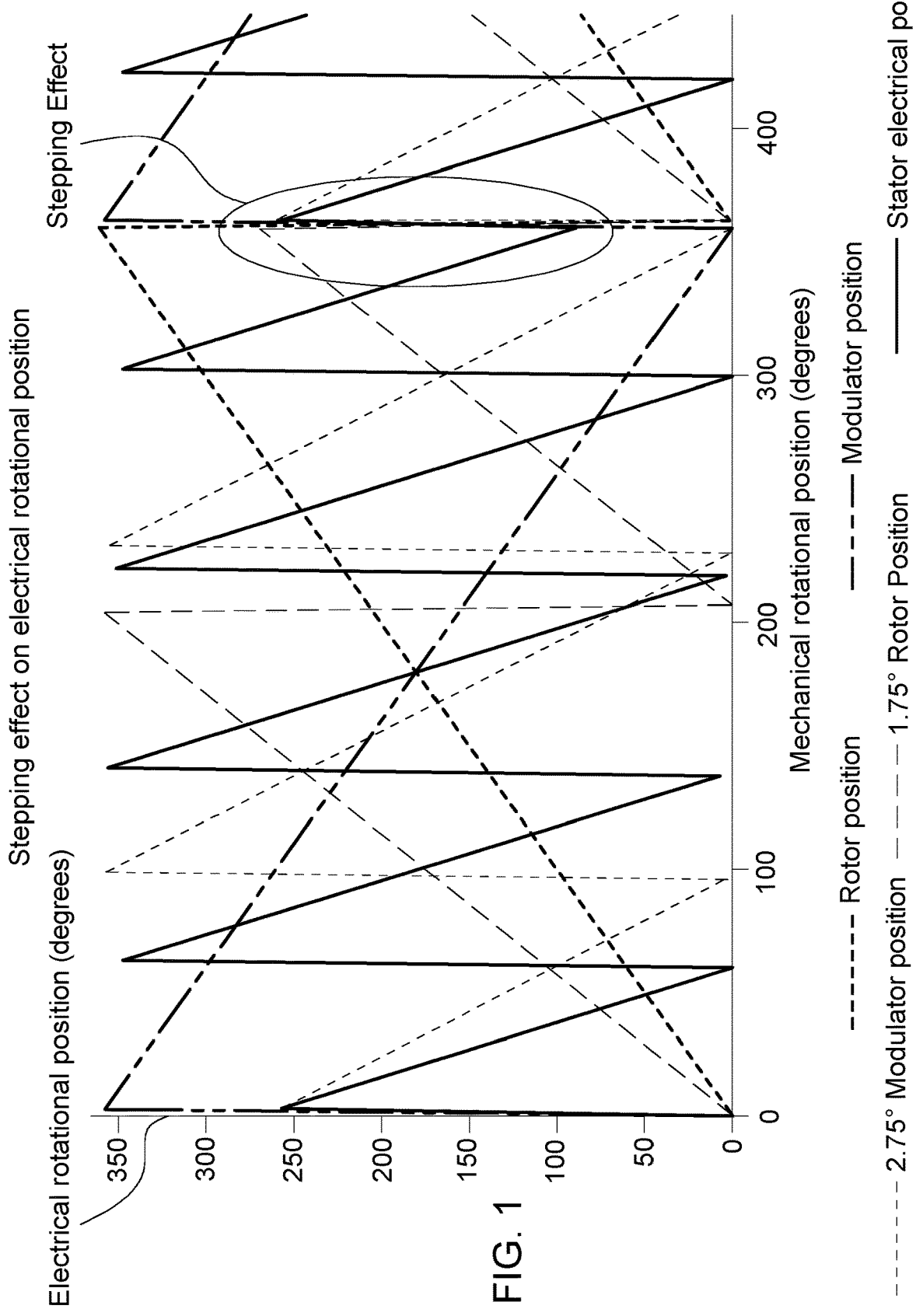

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), Digital Signal Processors (DSPs), Application-Specific-Integrated-Circuits (ASICs), Field Programmable Gate Arrays (FPGAs), computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits.

Further, at least one embodiment of the invention relates to a non-transitory computer-readable storage medium comprising electronically readable control information stored thereon, configured such that when the storage medium is used in a controller, at least one embodiment of the method is carried out.

Even further, any of the aforementioned methods may be embodied in the form of a program. The program may be stored on a non-transitory computer readable medium and is adapted to perform any one of the aforementioned methods when run on a computer device (a device including a processor). Thus, the non-transitory, tangible computer readable medium is adapted to store information and is adapted to interact with a data processing facility or computer device to execute the program of any of the above-mentioned embodiments and/or to perform the method of any of the above-mentioned embodiments.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

Some example embodiments relate to a determination of a virtual position of a stator electromagnetic field in a dual rotor electric machine. In a dual rotor electric machine, the virtual position of the stator electromagnetic field may be based on the position of the inner rotor and on the position of the modulator.

The rotation of the inner rotor, and separately the rotation of the modulator, do not necessarily lead to an equal rotation of the corresponding stator electromagnetic field. Thus, the position, speed and/or direction of the stator electromagnetic field may only be obtained by superpositioning the two rotation positions of the inner rotor and the modulator. This superpositioning may lead to a number of problems.

For example, while operation of dual rotor electrical machines in alternating current (AC) and/or direct current (DC) mode might be known, operations in speed mode (speed command) and/or torque mode (torque command) are being investigated. Field weakening and/or position offset calibration for dual rotor electrical machines are also being investigated.

A formula and/or an equation may be used to calculate the stator field position from two rotor field position resolvers. The position resolvers typically give a reading of between 0 and 360 degrees, resetting to 0 every 360 degrees.

When multiplied by decimal fractions, there may be a stepping effect that may make control difficult. The electromagnetic field of the stator may not be aligned with the electromagnetic field of the rotor and/or of the modulator.

For example, as illustrated in FIG. 1, the Stator electrical position (solid black line) may have abnormal behavior, e.g. may have a Stepping Effect, at a rotational position of 360 degrees.

Furthermore, while finite decimal fractions can be eliminated from the formula and/or equation by expanding to a least common multiple, periodic decimal fractions cannot. Periodic decimal fractions pose additional limitations.

According to some example embodiments, there is provided a system including a dual rotor electrical machine. The dual rotor electrical machine comprises a stator, an inner rotor including a first number of permanent magnet pole pairs, and a modulator including a second number of modulating segments. The system includes a controller configured to execute non-transitory machine readable instructions that, when executed by the controller, cause the system to determine a virtual position of an electromagnetic field of the stator based on a weighted sum of an angular position of the inner rotor and an angular position of the modulator, wherein weights in the weighted sum are based on the first number and the second number.

According to some example embodiments, the controller is configured to execute machine readable instructions to control the dual rotor electrical machine based on the determined virtual position of the electromagnetic field of the stator.

According to some example embodiments, the controller is configured execute machine readable instructions to synchronize the electromagnetic field of the stator with an electromagnetic field associated with the rotor and the modulator.

According to some example embodiments, the controller is configured to execute machine readable instructions to operate the dual rotor electrical machine according to at least one of a speed mode or a torque mode.

According to some example embodiments, the dual rotor electrical machine is configured to operate as at least one of a motor or a generator.

According to some example embodiments, the controller is configured to execute machine readable instructions determine the virtual position as, $$\text{Theta\_Stator} = -(n1/(n3-n1))*\text{Theta\_Rotor} + ((n1/(n3-n1))+1)*\text{Theta\_Modulator} + C\_3,$$

where Theta_Stator is the virtual position, Theta_Rotor is the angular position of the inner rotor, Theta_Modulator is the angular position of the modulator, n1 is the first number of permanent magnet pole pairs, n3 is the second number of modulating segments, and C_3 is a position offset.

According to some example embodiments, the system includes a first position resolver, the first position resolver configured to obtain the angular position of the inner rotor, and configured to provide the angular position to the controller.

According to some example embodiments, the system includes a second position resolver, the second position resolver configured to obtain the angular position of the modulator, and configured to provide the angular position of the modulator to the controller.

According to some example embodiments, the system includes a first shaft connected to the modulator, the first shaft having a first shaft angular position, where a first gear ratio is a ratio of a number of gears on the first shaft to a number of gears on the modulator. The controller is configured to execute machine readable instructions to determine the virtual position based on the first shaft angular and on the first gear ratio.

According to some example embodiments, the controller is configured to execute machine readable instructions to determine the virtual position as, $$\text{Theta\_Stator} = -(n1/(n3-n1))*\text{Theta\_Rotor} + ((n3/(n3-n1))+1)*\text{Ratio\_Shaft1}*\text{Theta\_Shaft1} + C\_3,$$

where Theta_Shaft1 is the first shaft angular position, Ratio_Shaft1 is the first gear ratio, Theta_Stator is the virtual position, Theta_Rotor is the angular position of the inner rotor, n1 is the first number of permanent magnet pole pairs, n3 is the second number of modulating segments, and C_3 is a position offset.

According to some example embodiments, the system includes a second shaft connected to the inner rotor, the second shaft having a second shaft angular position, where a second gear ratio is a ratio of a number of gears on the second shaft to a number of gears on the inner rotor. The controller is configured to execute machine readable instructions to determine the virtual position based on the second shaft angular position and the second gear ratio.

According to some example embodiments, the controller is configured to determine the virtual position as, $$\text{Theta\_Stator} = -(n1/(n3-n1))*\text{Ratio\_Shaft2}*\text{Theta\_Shaft2} + ((n3/(n3-n1))+1)*\text{Theta\_Modulator} + C\_3,$$

where Theta_Shaft2 is the second shaft angular position, Ratio_Shaft2 is the second gear ratio, Theta_Stator is the virtual position, Theta_Modulator is the angular position of the modulator, n1 is the first number of permanent magnet pole pairs, n3 is the second number of modulating segments, and C_3 is a position offset.

According to some example embodiments, the system includes a first shaft connected to the modulator, the first shaft having a first shaft angular position where a first gear ratio is a ratio of a number of gears on the first shaft to a number of gears on the modulator, and a second shaft connected to the inner rotor, the second shaft having a second shaft angular position, where a second gear ratio is a ratio of a number of gears on the second shaft to a number of gears on the inner rotor. The controller is configured to execute machine readable instructions to determine the virtual position based on the first shaft angular position, the first gear ratio, the second shaft angular position, and the second gear ratio.

According to some example embodiments, the controller is configured to execute machine readable instructions to determine the virtual position as, $$\text{Theta\_Stator} = -(n1/(n3-n1))^* \\ \text{Ratio\_Shaft2}^*\text{Theta\_Shaft2} + ((n3/(n3-n1))+1)^* \\ \text{Ratio\_Shaft1}^*\text{Theta\_Shaft1} + C\_3,$$

where Theta_Shaft1 is the first shaft angular position, Ratio_Shaft1 is the first gear ratio, Theta_Shaft2 is the second shaft angular position, Ratio_Shaft1 is the second gear ratio, Theta_Stator is the virtual position, n1 is the first number of permanent magnet pole pairs, n3 is the second number of modulating segments, and C_3 is a position offset.

According to some example embodiments, C_3 is a value between 0 degrees and 360 degrees.

According to some example embodiments, at least one of a position offset calibration run at startup of the dual rotor electrical machine determines C_3, or a factory and/or a dealer determines C_3.

According to some example embodiments, there is provided a method for operating a dual rotor electrical machine, the dual rotor electrical machine including a stator, an inner rotor including a first number of permanent magnet pole pairs, and a modulator including a second number of modulating segments and corresponding modulating rings. The method includes obtaining a first angular position of the inner rotor, obtaining a second angular position of the modulator, and determining a virtual position of an electromagnetic field of the stator, the virtual position based on a weighted sum of the first angular position and the second angular position, wherein weights in the weighted sum are based on the first number and the second number.

According to some example embodiments, the method includes controlling the dual rotor electrical machine based on the determined virtual position of the electromagnetic field of the stator.

According to some example embodiments, the method includes synchronizing the electromagnetic field of the stator with an electromagnetic field associated with the rotor and the modulator.

According to some example embodiments, the method includes operating the dual rotor electrical machine according to at least one of a speed mode or a torque mode.

According to some example embodiments, the method includes operating the dual rotor electrical machine as at least one of a motor or a generator.

According to some example embodiments, the determining the virtual position includes determining the virtual position as $$\text{Theta\_Stator} = -(n1/(n3-n1))^*\text{Theta\_Rotor} + ((n1/(n3-n1))+1)^*\text{Theta\_Modulator} + C\_3,$$

where Theta_Stator is the virtual position, Theta_Rotor is the angular position of the inner rotor, Theta_Modulator is the angular position of the modulator, n1 is the first number of permanent magnet pole pairs, n3 is the second number of modulating segments, and C_3 is a position offset.

According to some example embodiments, the obtaining the first angular position includes obtaining the first angular position from a first position resolver adjacent to the inner rotor.

According to some example embodiments, the obtaining the second angular position includes, obtaining the second angular position from a second position resolver adjacent to the modulator.

According to some example embodiments, the determining the virtual position includes, determining the virtual position based on a first shaft angular position and a first gear ratio, where the first gear ratio is a ratio of a number of gears on the first shaft to a number of gears on the modulator, the first shaft connected to the modulator.

According to some example embodiments, the determining the virtual position includes, determining the virtual position as, $$\text{Theta\_Stator} = -(n1/(n3-n1))^*\text{Theta\_Rotor} + ((n3/(n3-n1))+1)^*\text{Ratio\_Shaft1}^*\text{Theta\_Shaft1} + C\_3,$$

where Theta_Shaft1 is the first shaft angular position, Ratio_Shaft1 is the first gear ratio, Theta_Stator is the virtual position, Theta_Rotor is the angular position of the inner rotor, n1 is the first number of permanent magnet pole pairs, n3 is the second number of modulating segments, and C_3 is a position offset.

According to some example embodiments, the determining the virtual position includes, determining the virtual position based on a second shaft angular position and a second gear ratio, where a second gear ratio is a ratio of a number of gears on the second shaft to a number of gears on the inner rotor, the second shaft connected to inner rotor.

According to some example embodiments, the determining the virtual position includes, determining the virtual position as, $$\text{Theta\_Stator} = -(n1/(n3-n1))^* \\ \text{Ratio\_Shaft2}^*\text{Theta\_Shaft2} + ((n3/(n3-n1))+1)^* \\ \text{Theta\_Modulator} + C\_3,$$

where Theta_Shaft2 is the second shaft angular position, Ratio_Shaft2 is the second gear ratio, Theta_Stator is the virtual position, Theta_Modulator is the angular position of the modulator, n1 is the first number of permanent magnet pole pairs, n3 is the second number of modulating segments, and C_3 is a position offset.

According to some example embodiments, the determining the virtual position includes, determining the virtual position based on a first shaft angular position and a first gear ratio of a first shaft connected to the modulator and based on a second shaft angular position and a second gear ratio of a second shaft connected to inner rotor, where the first gear ratio is a ratio of a number of gears on the first shaft to a number of gears on the modulator and the second gear ratio is a ratio of a number of gears on the second shaft to a number of gears on the inner rotor.

According to some example embodiments, the determining the virtual position includes, determining the virtual position as, $$\text{Theta\_Stator} = -(n1/(n3-n1))^* \\ \text{Ratio\_Shaft2}^*\text{Theta\_Shaft2} + ((n3/(n3-n1))+1)^* \\ \text{Theta\_Ratio\_Shaft2}^*\text{Theta\_Shaft2} + C\_3,$$

where Theta_Shaft1 is the first shaft angular position, Ratio_Shaft1 is the first gear ratio, Theta_Shaft2 is the second shaft angular position, Ratio_Shaft1 is the second gear ratio, Theta_Stator is the virtual position, n1 is the first number of permanent magnet pole pairs, n3 is the second number of modulating segments, and C_3 is a position offset.

According to some example embodiments, at least one of a position offset calibration run at startup of the dual rotor electrical machine determines C_3, or a factory and/or a dealer determines C_3.

According to some example embodiments, C_3 is a value between 0 degrees and 360 degrees.

According to some example embodiments, there is provided a non-transitory computer readable medium, when executed by a controller in a system including a dual rotor electrical machine having a stator, an inner rotor including a first number of permanent magnet pole pairs, and a modulator including a second number of modulating segments and corresponding modulating rings, is configured to cause the system to obtain a first angular position of the inner rotor, obtain a second angular position of the modulator, and determine a virtual position of an electromagnetic field of the stator, the virtual position based on a weighted sum of the first angular position and the second angular position, wherein weights in the weighted sum are based on the first number and the second number.

According to some example embodiments, the non-transitory computer readable medium, when executed by the controller, is configured to cause the system to control the dual rotor electrical machine based on the virtual position.

According to some example embodiments, the non-transitory computer readable medium, when executed by the controller, is configured to cause the system to, synchronize the electromagnetic field of the stator with an electromagnetic field associated with the rotor and the modulator.

According to some example embodiments, the non-transitory computer readable medium, when executed by the controller, is configured to cause the system to operate the dual rotor electrical machine according to at least one of a speed mode or a torque mode.

According to some example embodiments, the non-transitory computer readable medium, when executed by the controller, is configured to cause the system to operate the dual rotor electrical machine as at least one of a motor or a generator.

According to some example embodiments, the non-transitory computer readable medium, when executed by the controller, is configured to cause the system to determine the virtual position as, $$\text{Theta\_Stator} = -(n1/(n3-n1))*\text{Theta\_Rotor} + ((n1/(n3-n1))+1)*\text{Theta\_Modulator} + C\_3,$$

where Theta_Stator is the virtual position, Theta_Rotor is the angular position of the inner rotor, Theta_Modulator is the angular position of the modulator, n1 is the first number of permanent magnet pole pairs, n3 is the second number of modulating segments, and C_3 is a position offset.

According to some example embodiments, the non-transitory computer readable medium, when executed by the controller, is configured to cause the system to obtain the first angular position from a first position resolver adjacent to the inner rotor.

According to some example embodiments, the non-transitory computer readable medium, when executed by the controller, is configured to cause the system to obtain the first position from a second position resolver adjacent to the modulator.

According to some example embodiments, the non-transitory computer readable medium, when executed by the controller, is configured to determine the virtual position based on a first shaft angular position and a first gear ratio, where the first gear ratio is a ratio of a number of gears on the first shaft to a number of gears on the modulator, the first shaft connected to the modulator.

According to some example embodiments, the non-transitory computer readable medium, when executed by the controller, is configured to cause the system to determine the virtual position as, $$\text{Theta\_Stator} = -(n1/(n3-n1))*\text{Theta\_Rotor} + ((n3/(n3-n1))+1)*\text{Ratio\_Shaft1}*\text{Theta\_Shaft1} + C\_3,$$

where Theta_Shaft1 is the first shaft angular position, Ratio_Shaft1 is the first gear ratio, Theta_Stator is the virtual position, Theta_Rotor is the angular position of the inner rotor, n1 is the first number of permanent magnet pole pairs, n3 is the second number of modulating segments, and C_3 is a position offset.

According to some example embodiments, the non-transitory computer readable medium, when executed by the controller, is configured to cause the system to determine the virtual position based on a second shaft angular position and a second gear ratio, where the second gear ratio is a ratio of a number of gears on the second shaft to a number of gears on the inner rotor, the second shaft connected to the inner rotor.

According to some example embodiments, the non-transitory computer readable medium, when executed by the controller, is configured to cause the system to determine the virtual position as, $$\text{Theta\_Stator} = -(n1/(n3-n1))*\text{Ratio\_Shaft2}*\text{Theta\_Shaft2} + ((n3/(n3-n1))+1)*\text{Theta\_Modulator} + C\_3,$$

where Theta_Shaft2 is the second shaft angular position, Ratio_Shaft2 is the second gear ratio, Theta_Stator is the virtual position, Theta_Modulator is the angular position of the modulator, n1 is the first number of permanent magnet pole pairs, n3 is the second number of modulating segments, and C_3 is a position offset.

According to some example embodiments, the non-transitory computer readable medium, when executed by the controller, is configured to cause the system to determine the virtual position based on a first shaft angular position and a first gear ratio of a first shaft connected to the modulator and based on a second shaft angular position and a second gear ratio of a second shaft connected to inner rotor.

According to some example embodiments, the non-transitory computer readable medium, when executed by the controller, is configured to cause the system to determine the virtual position as, $$\text{Theta\_Stator} = -(n1/(n3-n1))*\text{Ratio\_Shaft1}*\text{Theta\_Shaft1} + ((n3/(n3-n1))+1)*\text{Theta\_Shaft2}*\text{Theta\_Shaft2} + C\_3,$$

where Theta_Shaft1 is the first shaft angular position, Ratio_Shaft1 is the first gear ratio, Theta_Shaft2 is the second shaft angular position, Ratio_Shaft1 is the second gear ratio, Theta_Stator is the virtual position, n1 is the first number of permanent magnet pole pairs, n3 is the second number of modulating segments, and C_3 is a position offset.

According to some example embodiments, at least one of a position offset calibration run at startup of the dual rotor electrical machine determines C_3, or a factory and/or a dealer determines C_3.

According to some example embodiments, C_3 is a value between 0 degrees and 360 degrees.

Some non-limiting example embodiments may be described below.

Figure 2:
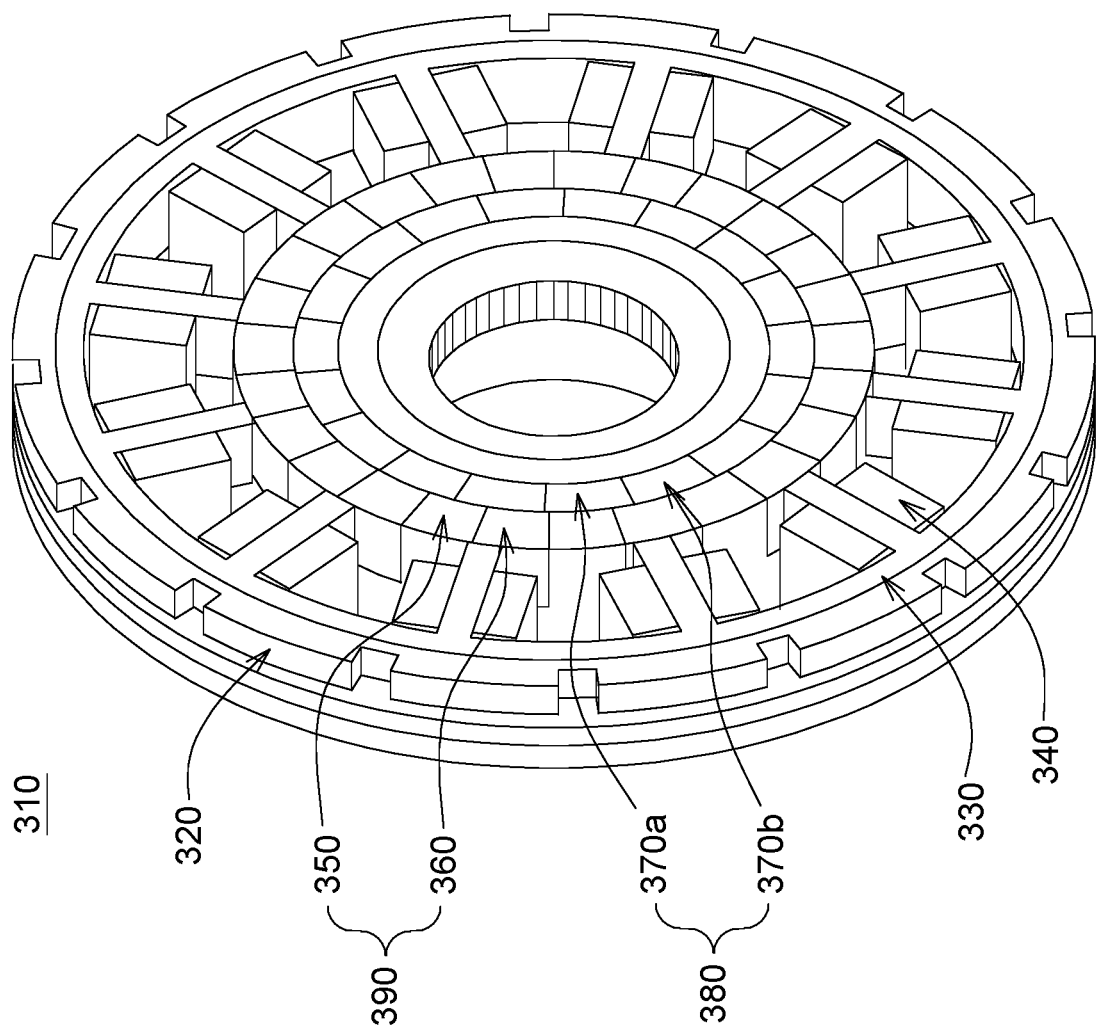

FIG. 2 illustrates a dual rotor electrical machine according to some example embodiments.

Referring to FIG. 2, a dual rotor electrical machine 310 according to some example embodiments may include a stator cooling jacket 320, a stator 330, conductive coils 340, a modulator 390 including non-magnetic or weak magnetic segments 350 and modulating ferromagnetic segments 360, and an inner rotor 380 including permanent magnets having magnets radially polarized inside to outside as in magnet portion 370a and outside to inside as in magnet portion 370b.

The stator cooling jacket 320 may cool the stator 330; however, example embodiments are not limited thereto.

The stator 330 may be physically stationary, e.g. may be physically stationary during operation of the dual rotor electrical machine 310. However, example embodiments are not limited thereto, and the stator 330 may be physically mobile, and/or may physically rotate.

The modulator 390 may include a number of ferromagnetic modulating segments 360 corresponding to a number of non-magnetic or weak magnetic segments 350. A number of modulating segments 360 may be an integer n3. Within the dual rotor electrical machine 310, n3 may be a constant associated with the modulator 390. However, the dual rotor electrical machine 310 may have individual components replaced, and different modulators 390 may have a different number of non-magnetic or weak magnetic segments 350.

As illustrated in FIG. 2, n3 is thirteen; however, example embodiments are not limited thereto, and n3 may be an integer greater than thirteen, or an integer greater than zero and less than thirteen. For example, n3 may be one, two, three, four, five, six, seven, eight, nine, ten, eleven, twelve, thirteen, fourteen, fifteen, etc.

Within the modulator 390, the modulating segments 360 may be composed of a ferromagnetic material, e.g. may be composed of a material that is attractive to a magnetic force. For example, the modulating segments 360 may be composed of a material containing iron. Within the modulator 390, the non-magnetic or weak magnetic segments 350 may be composed of a non-ferromagnetic material, e.g. may be composed of a material that is not attracted to a magnetic force. Around the modulating segments 360, there may be at least one of air, a composite material, or a plastic.

The inner rotor 380 may include pairs of permanent magnets. For example, as illustrated in FIG. 2, each pair of permanent magnet may include a magnet radially polarized inside to outside as in magnetic portion 370a and a magnets radially polarized outside to inside as in magnetic portion 370b.

Alternatively or additionally, there may be other arrangements of the magnetic portion 370a and the magnetic portion 370b. For example, there may be block permanent magnets in a "V" shape. Magnets may be split into tangential, axial, and/or radial directions relative to the inner rotor 380 and multiple magnets together may create one half of a pole pair.

The inner rotor 380 may comprise one or more inner magnetic-field modulating members, (inner) permanent magnets, (inner) permanent magnet pole pairs, and ferrous, iron core or permeability-modulating members that can alter, direct or focus electromagnetic fields, magnetic induction, and/or their components. Similarly, the modulator 390 may be referred to as an outer rotor that may comprise one or more magnetic-field modulating segments, such as (outer) permanent magnets, (outer) permanent magnet pole pairs, and ferrous, iron core or permeability-modulating members that can alter, direct or focus electromagnetic fields, magnetic induction, or their components. In some example embodiments, the modulator 390 (e.g., aggregate modulator) may be referred to as an outer rotor, or a combination of an inner rotor and an outer rotor, which can be configured to be rotatable with respect to each other on a synchronous rotational basis (e.g., synchronous rotational operational mode permanent magnets of the inner rotor and the outer rotor) and/or an asynchronous rotational basis (e.g., during any alignment phase for synchronous rotational operational mode of the permanent magnets of the inner rotor and outer rotor).

A number of permanent magnet pole pairs may be an integer n1. Within a dual rotor electrical machine 310, n1 may be a constant associated with the inner rotor 380. However, the dual rotor electrical machine 310 may have individual components replaced, and different inner rotors 380 may have a different number of permanent magnet pole pairs.

As illustrated in FIG. 2, n1 is nine; however, example embodiments are not limited thereto, and n1 may be an integer greater than nine, or an integer greater than zero and less than nine. For example, n1 may be one, two, three, four, five, six, seven, eight, nine, ten, eleven, twelve, thirteen, fourteen, fifteen, etc.

A determination of the number n1 of permanent magnet pole pairs may include placement of a compass next to the inner rotor 380, rotating the inner rotor 380 through a full 360 degree rotation, and counting the number of 180 degree changes of direction of the compass needle per one revolution of the inner rotor 380. The number of 180 degree changes of direction of the compass needle divided by 2 per one rotation of the inner rotor 380 may correspond to the number n1 of permanent magnet pole pairs.

Alternatively or additionally, the number n1 of permanent magnet pole pairs may be determined based on a two-dimensional measurement map of the radial intensity of the magnetic field around the inner rotor 380. For example, the number n1 of permanent magnet pole pairs may correspond to a number of distinct peaks or valleys within the two-dimensional measurement map of the radial intensity of the magnetic field around the inner rotor 380.

The number n3 of modulating segments 360 may be the same as, or may be different from, the number n1 of pairs of permanent magnets corresponding to magnets radially polarized inside to outside as in magnetic portion 370a and magnets radially polarized outside to inside as in magnetic portion 370b. Furthermore, the number n3 of modulating segments 360 may be relatively prime with the number n1 of pairs of permanent magnets. However, example embodiments are not limited thereto.

The stator 330 may be operated with AC current, e.g. may be operated with three-phase current. However, example embodiments are not limited thereto. For example, three-phase current may be applied to the conductive coils 340, creating a magnetic field. An inductive force may be generated based on the magnetic field generated by the three-phase current applied to the conductive coils 340. Alternatively or additionally, a three-phase current may be generated in the conductive coils 340 by rotation of the modulator 390 and the magnetic pole pairs including magnets radially polarized inside to outside as in magnetic portion 370a and magnets radially polarized outside to inside as in magnetic portion 370b within the inner rotor 380.

A frequency of the three-phase current may be, but is not limited to be, 60 Hz. Alternatively, a frequency of the three-phase current may be, but is not limited to be, 50 Hz. Example embodiments are not limited thereto.

An inductive force generated by the magnetic field created by the three-phase current applied to the conductive coils 340 comprising the stator 330 may induce a rotation of the modulator 390 and the inner rotor 380. For example, much as planetary gear sets rotate, the modulator 390 and inner rotor 380 may rotate based on the inductive force around the conductive coils 340.

Figure 3:
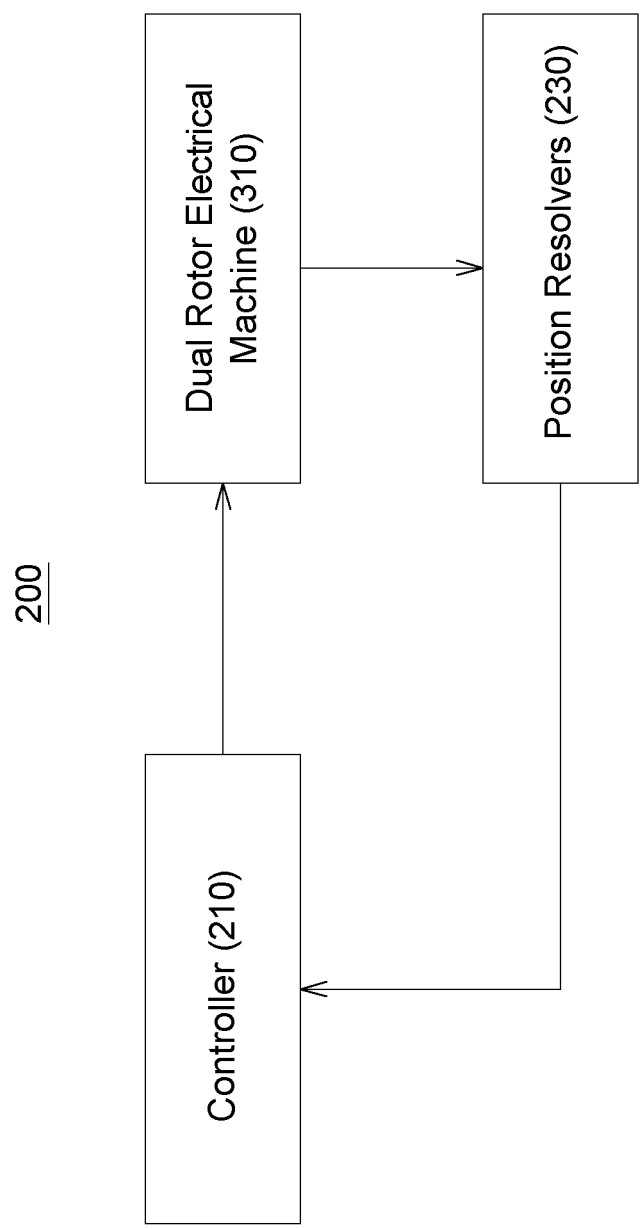

FIG. 3 illustrates a system for operating a dual rotor electrical machine.

Referring to FIG. 3, a system 200 for operating a dual rotor electrical machine 310 with a controller 210 is illustrated.

The controller 210 may be or may include circuitry for operating the dual rotor electrical machine 310. The controller 210 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Moreover, the controller 210 may include features such as those described in U.S. Pat. No. 9,442,029, the entire contents of which are herein incorporated by reference.

The controller 210 may receive angular position information from position resolvers 230, may determine a virtual position of a stator included in the dual rotor electrical machine 310 based on the angular information received from the position resolvers 230, and may control the dual rotor electrical machine 310 based on the determined virtual position.

The controller 210 may issue commands to the dual rotor electrical machine 310. For example, the controller 210 may issue a command to the dual rotor electrical machine 310 to control the dual rotor electrical machine 310 based on the determined virtual position of the stator within the dual rotor electrical machine 310. When the dual rotor electrical machine 310 operates in torque mode, the commands may correspond to current commands. When the dual rotor electrical machine 310 operates in speed mode, the commands may correspond to frequency commands.

The dual rotor electrical machine 310 may operate based on the commands from the controller 210. For example, the dual rotor electrical machine 310 may operate as either a motor to generate mechanical energy, or as a generator to generate electrical energy. Alternatively or additionally, the dual rotor electrical machine 310 may operate in at least one of a speed mode or torque mode. In the speed mode, the dual rotor electrical machine 310 operates such that the stator operates at a given (fundamental) frequency. In the torque mode, the dual rotor electrical machine 310 operates such that the stator provides a given torque.

The controller 210 may operate to generate, prepare, and use Id/Iq lookup tables based on the determined virtual position. Alternatively or additionally, the controller 210 may perform field weakening operations based on the determined virtual position. Alternatively or additionally, the controller 210 may perform position offset calibrations based on the determined virtual position.

The position resolvers 230 may determine a position for each of the inner rotor and the modulator adjacent to the dual rotor electrical machine 310. There may be two positon resolvers 230 within the system 200; however, example embodiments are not limited thereto. The position resolvers 230 may obtain the angular positions of the inner rotor and the modulator, respectively, and may provide the angular positions to the controller 210.

The position resolvers 230 may determine the angular positions of the inner rotor and/or the modulator in dual rotor electrical machine 310, and may be attached to, e.g. directly attached to, or adjacent to, the modulator and/or the inner rotor of the dual rotor electrical machine 310. Alternatively or additionally, the position resolvers 230 may not be attached to or adjacent to the dual rotor electrical machine 310.

The controller 210 may receive position information from the position resolvers 230. For example, the controller 210 may receive position information over a channel from the position resolvers 230. The channel may be or may include a wired channel or another communication channel between the controller 210 and the position resolvers 230.

The controller 210 may issue commands, e.g. instructions, to the dual rotor electrical machine 310. The controller 210 may issue the commands through a channel to the dual rotor electrical machine 310. The channel may be or may include a wired channel, or another communication channel between the controller 210 and the dual rotor electrical machine 310.

The controller 210 determines the virtual position of the electromagnetic field around the stator within the dual rotor electrical machine 310. The electromagnetic field around the stator may be rotating.

From the determined virtual position of the electromagnetic field around the stator, the controller 210 operates the dual rotor electrical machine 310 as if the dual rotor electrical machine 310 were a single rotor electrical machine. For example, from a point of view of the stator, the stator only experiences a single rotating electromagnetic field. The stator acts independent of whether the rotating electromagnetic field is created by a single rotating component or by two rotating components. Accordingly, operation of the dual rotor electrical machine 310 may be performed as if the dual rotor electrical machine 310 were a single rotor machine.

Figure 4:
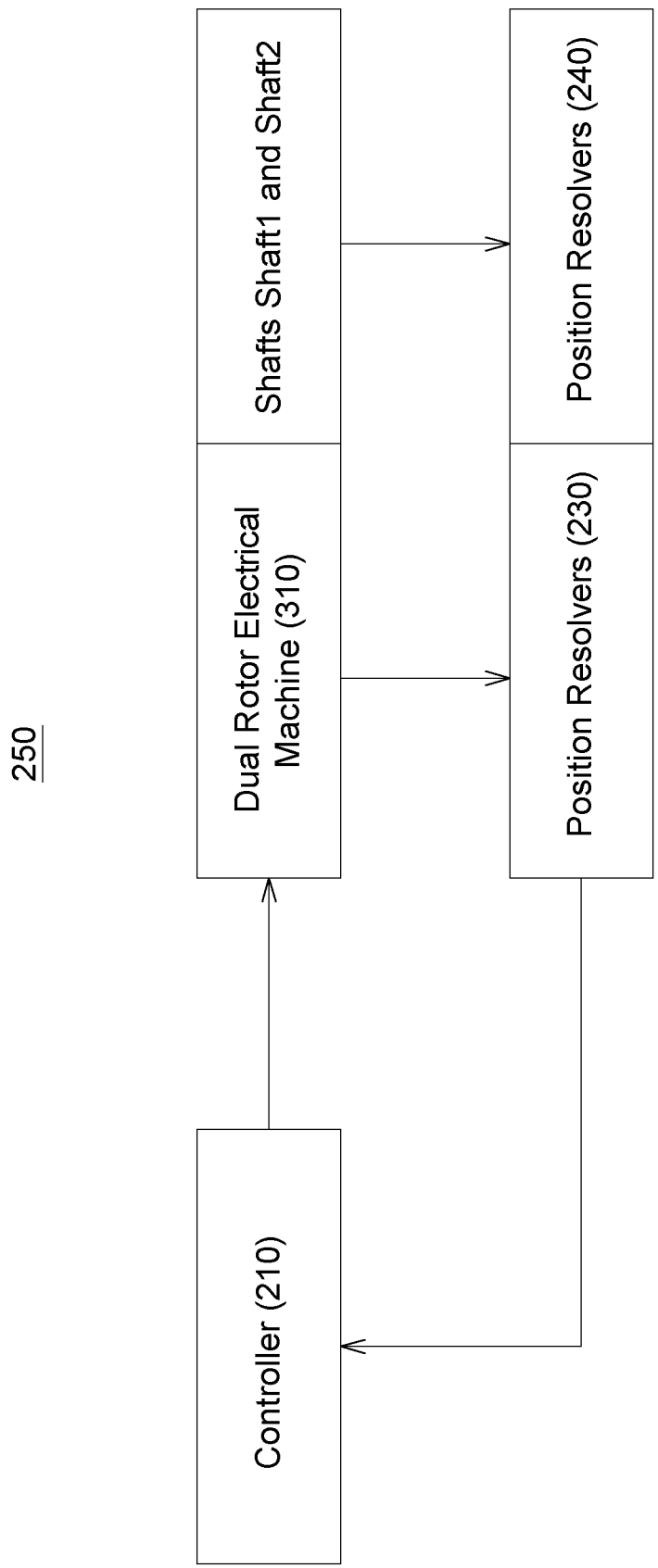

FIG. 4 illustrates a system for controlling a dual rotor electrical machine, according to some example embodiments.

A system 250 according FIG. 4 may operate similarly to the system 200 as shown in FIG. 3. Descriptions of common features may be omitted for brevity.

As illustrated in FIG. 4, a system 250 may include a controller 210, a dual rotor electrical machine 310, one or more position resolvers 230 connected to the dual rotor electrical machine 310, shafts Shaft1 and Shaft2 connected to the dual rotor electrical machine 310, and one or more position resolvers 240 connected to or adjacent to either or both of shafts Shaft1 and Shaft2. The position resolvers 230 may be connected to and/or adjacent to the inner rotor 380 and/or the modulator 390 described above, and the position resolvers 240 may be connected to and/or adjacent to the shafts Shaft1 and Shaft2.

The position resolvers 240 may determine a position of shaft Shaft1 and/or shaft Shaft2. As illustrated in more detail below with reference to FIG. 6a and FIG. 9a. shaft Shaft1 may be connected to the modulator 390, and shaft Shaft2 may be connected to the inner rotor 380.

Figure 5C:
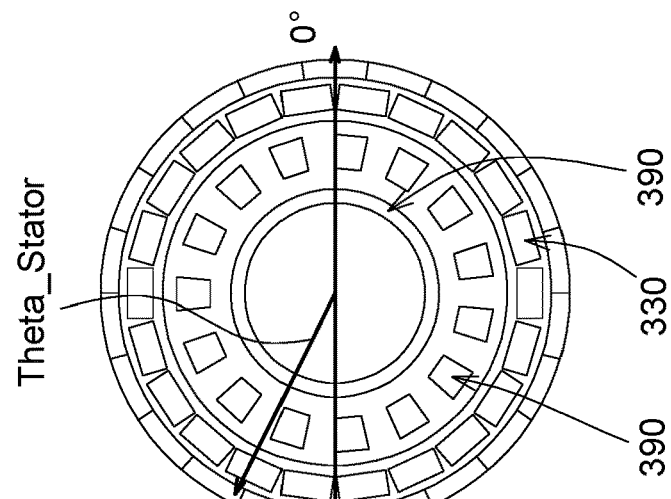
FIGS. 5a-5c illustrate a dual rotor electrical machine along with angles Theta_Rotor, Theta_Modulator, and Theta_Stator, according to some example embodiments.
Figure 5B:
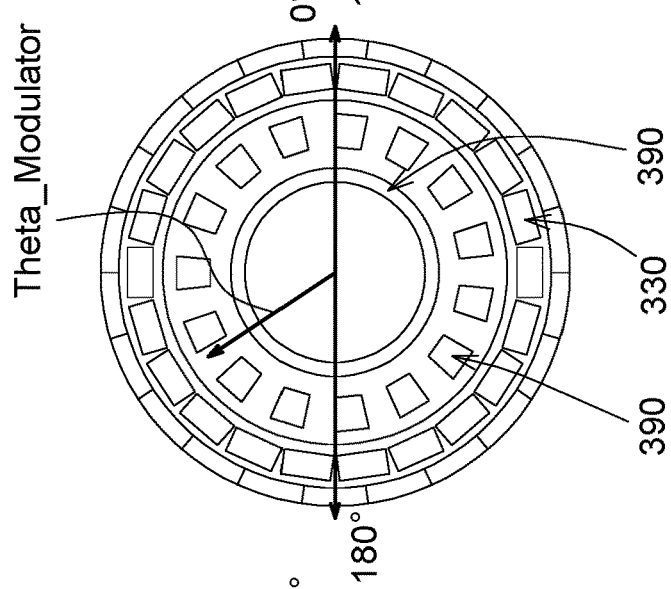
Figure 5A:
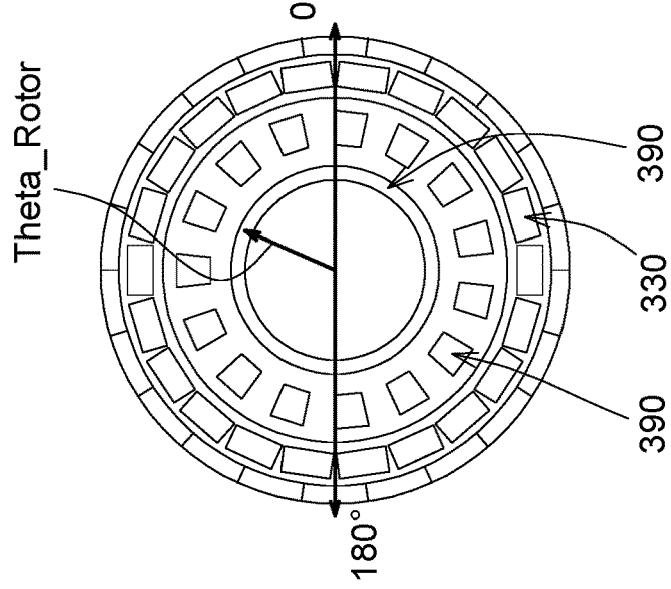
Figure 6A:
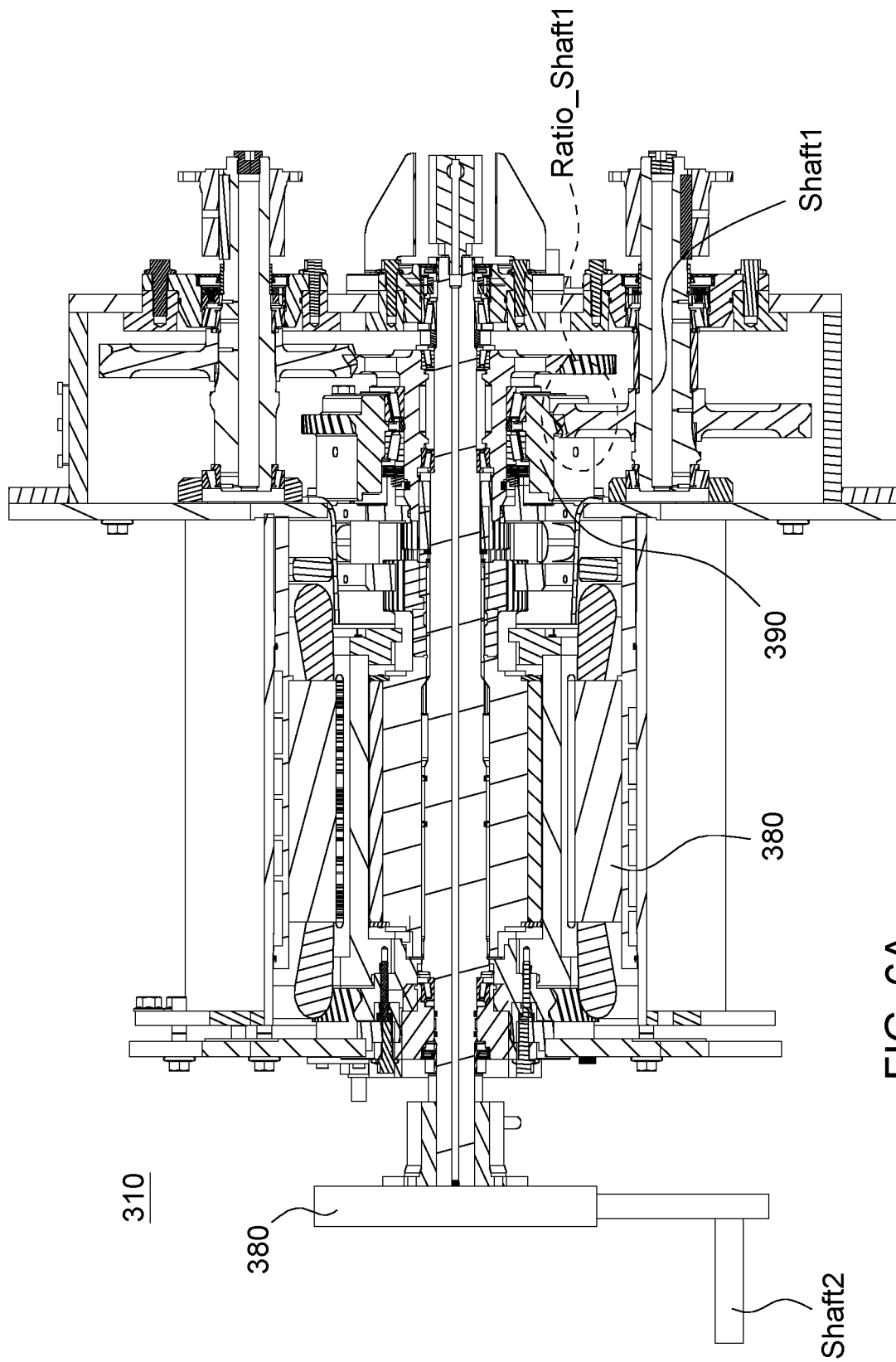
FIG. 6a illustrates a side-view of a dual rotor electrical machine along with attached shafts, according to some example embodiments.
Figure 6B:
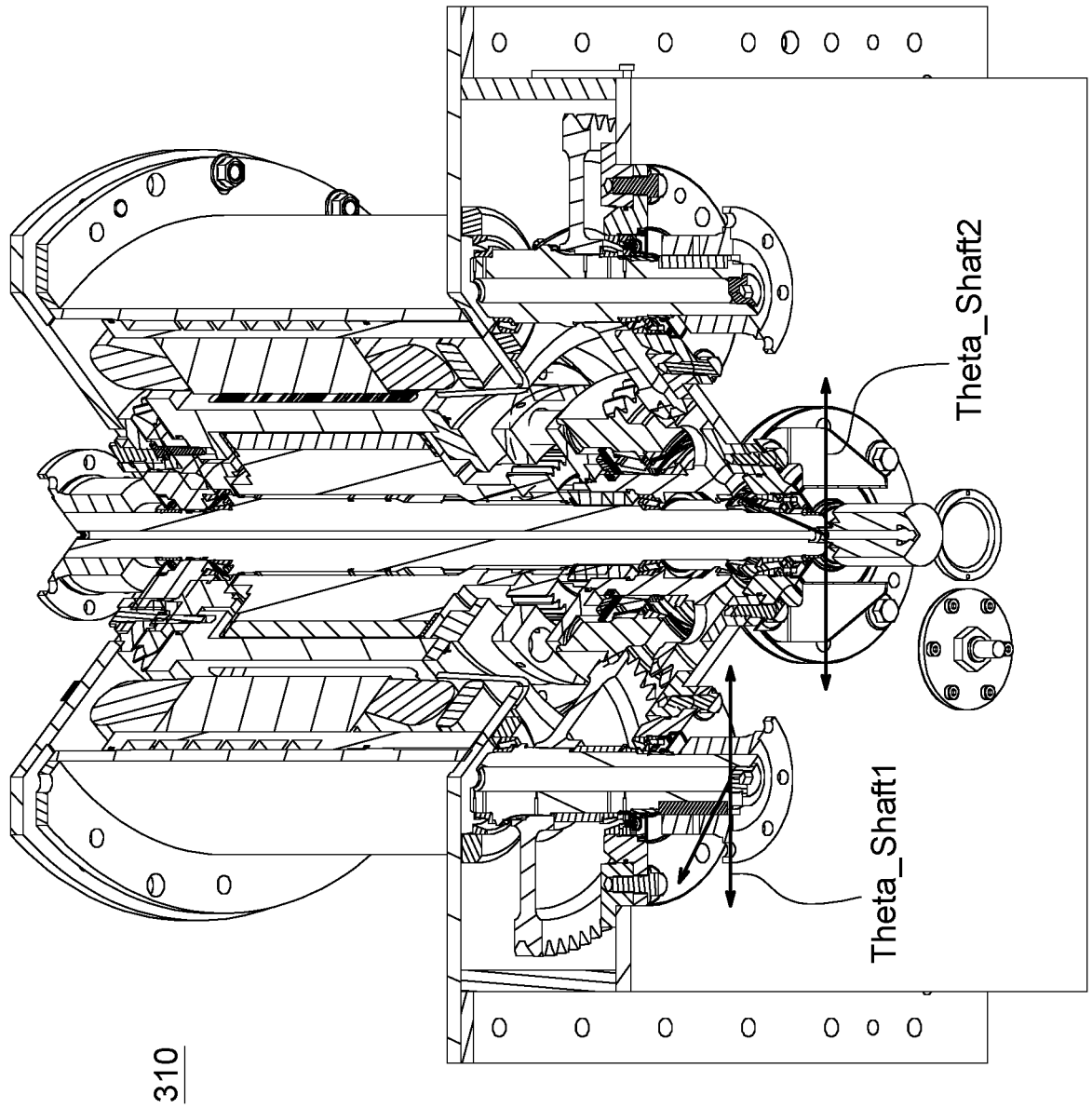
FIG. 6b illustrates a parametric view of a dual rotor electrical machine illustrating angles of attached shafts, according to some example embodiments.

FIGS. 5a-5c illustrate a dual rotor electrical machine along with angles Theta_Rotor, Theta_Modulator, and Theta_Stator, according to some example embodiments. FIG. 6a illustrates a side-view of a dual rotor electrical machine 310 along with shafts Shaft1 and Shaft2 attached to the dual rotor electrical machine 310, according to some example embodiments. FIG. 6b illustrates a parametric view of a dual rotor electrical machine 310, according to some example embodiments.

At least one position resolver 230 adjacent to/connected to the inner rotor 380 may determine an angle Theta_Rotor of the inner rotor 380 to FIG. 5a. The angle Theta_Rotor may be based on an angle measured from a polar axis of the inner rotor 380. The polar axis of Theta_Rotor may be horizontal; however, example embodiments are not limited thereto. As described herein, Theta_Rotor may be an angle measured in degrees between 0 and 360; however, example embodiments are not limited thereto, and Theta_Rotor may be an angle measured in other units, for example, measured in radians between 0 and 2*pi.

At least one position resolver 230 adjacent to/connected to the modulator 390 may determine an angle Theta_Modulator. The angle Theta_Modulator may be based on an angle measured from a polar axis of the modulator 390. The polar axis of Theta_Modulator may be horizontal; however, example embodiments are not limited thereto. Furthermore the polar axis of Theta_Modulator may be the same, or different, from the polar axis of Theta_Rotor. As described herein, Theta_Modulator may be an angle measured in degrees between 0 and 360; however, example embodiments are not limited thereto, and Theta_Modulator may be an angle measured in other units, for example, measured in radians between 0 and 2*pi.

As used herein, a virtual angle Theta_Stator may be associated with an electromagnetic magnetic field of the stator 330.

According to some example embodiments, the virtual angle Theta_Stator may be determined based on the angle Theta_Rotor, the angle Theta_Modulator, the number n1 of pairs of portions 370a and portions 370b referred to above with reference to FIG. 2, and the number n3 of modulating segments 360 referred to above with reference to FIG. 2.

As described herein, Theta_Stator may be an angle measured in degrees between 0 and 360; however, example embodiments are not limited thereto, and Theta_Stator may be an angle measured in other units, for example, measured in radians between 0 and 2*pi.

Furthermore, according to some example embodiments, the virtual angle Theta_Stator may be based on a position offset C_3. The position offset C_3 may correspond to an "integration constant." The position offset C_3 may be an angle measured in degrees between 0 degrees and 360 degrees. Alternatively, the position offset C_3 may be an angle measured in degrees between 0 and 360/n1. For example, the position offset C_3 corresponds to an "integration constant" whose multiplication and/or division leads to another constant that can be absorbed into the equations. If Theta_Rotor and Theta_Modulator are measured in radians, then position offset C_3 may be an angle measured in radians between 0 and 2pi, or between 0 and 2pi/n1.

The position offset C_3 may be determined, e.g. may be determined with a position offset calibration run at startup of the dual rotor electrical machine 310. Alternatively, a factory and/or a dealer may determine the position offset C_3 based on empirical data.

Although in FIGS. 1 and 7 discussed below, C_3 is set to zero, example embodiments are not limited thereto. For example, C_3 may be determined by forcing the modulator 390 to be stationary, then applying a rotating electromagnetic field to the stator 330. The inner rotor 380 will rotate. C_3 may be obtained by applying a constant torque to the inner rotor 380, varying C_3, and measuring current through the stator 380. C_3 may correspond to a value having a minimal or low current through the stator 380.

According to some example embodiments, each of, or at least one of, n1 or n3 may be considered constants; however, example embodiments are not limited thereto. Furthermore, according to some example embodiments, each of, or at least one of, Theta_Rotor, Theta_Modulator, and Theta_Stator, may be considered variables; however, example embodiments are not limited thereto.

According to some example embodiments, a controller, e.g. the controller 210 described above with reference to FIG. 3 or FIG. 4, may calculate the virtual angle Theta_Stator as follows:

$$\text{Theta\_Stator}=-(n1/(n3-n1))*\text{Theta\_Rotor}+((n3/(n3-n1))+1)*\text{Theta\_Modulator}+C\_3 \quad \text{(Equation 1)}.$$

Equation 1 may be thought of as an equation for Theta_Stator based on a weighted sum of Theta_Rotor and Theta_Modulator. Weights within the weighted sum are based on the number n1 of permanent magnet pole pairs and the number n3 of modulating segments.

Based on Equation 1, in some cases, a position Theta_Stator of the magnetic field of the stator 330 may include finite decimal fractions.

For example, as a non-limiting example, one may have n1=7 and n3=11. Accordingly, Equation 1 provides:

$$\text{Theta\_Stator}=-(7/(11-7))*\text{Theta\_Rotor}+((7/(11-7))+1)*\text{Theta\_Modulator}+C\_3, \text{ or}$$

$$\text{Theta\_Stator}=-1.75*\text{Theta\_Rotor}+2.75*\text{Theta\_Modulator}+C\_3$$

A stepping effect may be present in operation of a dual rotor electrical machine 310 with such an equation, because of the non-whole numbers 1.75 and/or 2.75. This stepping effect can be improved/resolved by rearranging Equation 1 so that only integer values can appear, as in:

$$(n3-n1)*\text{Theta\_Stator}=-n1*\text{Theta\_Rotor}+n3*\text{Theta\_Modulator}+C\_3' \quad \text{(Equation 2)}.$$

Here, C_3' corresponds to C_3 multiplied by (n3−n1).

As a non-limiting example, when n3=11 and n1=7, this may simplify to:

$$4*\text{Theta\_Stator}=-7*\text{Theta\_Rotor}+11*\text{Theta\_Modulator}+C\_3'$$

Based on Equations 1 or 2, the controller 210 may obtain the virtual position Theta_Stator of the resulting magnetic field.

For example, based on the determined position Theta_Stator, the controller 210 may operate the dual rotor electrical machine 310.

For example, based on the determined position Theta_Stator and a given speed, the controller 210 may operate the dual rotor electrical machine 310 to rotate the electromagnetic field created by the stator 320 at a frequency corresponding to the given speed.

For example, based on the determined position Theta_Stator and a given torque, the controller 210 may operate the dual rotor electrical machine 310 to apply a set (or, alternatively, variable or predetermined) torque at the stator 320.

Additionally referring to FIGS. 4 and 6a, the dual rotor electrical machine 310 may have shafts Shaft1 and Shaft2 connected thereto. Shaft Shaft1 may be connected to the modulator 390. There may be a ratio of gears Ratio_Shaft1 between shaft Shaft1 and modulator 390. Shaft Shaft2 may be connected to the inner rotor 380. There may be a ratio of gears Ratio_Shaft2 between shaft Shaft2 and the inner rotor 380.

Referring to FIG. 6b, shaft Shaft1 may be at an angle Theta_Shaft1. Furthermore, shaft Shaft2 may be at an angle Theta_Shaft2.

Referring back to FIG. 4, the angles Theta_Shaft1 and Theta_Shaft2 may be determined by position resolvers. For example, at least one position resolver 240 may determine the angular position Theta_Shaft1. Alternatively or additionally, at least one position resolver 240 may determine the angular position Theta_Shaft2.

According to some example embodiments, the controller 210 may obtain either or both of the position Theta_Rotor and Theta_Modulator from position resolvers 230. Alternatively or additionally, the controller 210 may obtain either or both of the positions Theta_Shaft1 and Theta_Shaft2 of shafts Shaft1 and Shaft2 from position resolvers 240 connected to shafts Shaft1 and Shaft2.

The controller 210 may determine the virtual position of the stator 330 based on the positions of either or both of Theta_Shaft1 or Theta_Shaft2, along with either or both of the gear ratios Ratio_Shaft1 and Ratio_Shaft2.

For example, the controller 210 may obtain the position Theta_Shaft1 of shaft Shaft1 having a spur gear set with a ratio Ratio_Shaft1, in which case the controller 210 Theta_Stator may be determined as:

Theta_Stator=−(n1/(n3−n1))*Theta_Rotor+((n3/(n3−n1))+1)*Ratio_Shaft1*Theta_Shaft1+C_3   (Equation 3).

As a non-limiting example embodiment, let the modulator 390 be connected to shaft Shaft1 with a spur gear set with a ratio of −2.1 from which position is obtained, the equation changes to:

4*Theta_Stator=−7*Theta_Rotor−23.1*Theta_Shaft1+C_3

These finite decimal fractions may be eliminated to reduce a stepping effect, in this case by multiplying by 10:

40*Theta_Stator=−70*Theta_Rotor−231*Theta_Shaft1+C_3

According to some example embodiments, the controller 210 may obtain the position Theta_Rotor from the position Theta_Shaft2 of shaft Shaft2 having a spur gear set with a ratio Ratio_Shaft2, in which case Theta_Stator may be determined as follows:

Theta_Stator=−(n1/(n3−n1))*Ratio_Shaft2*Theta_Shaft2+((n3/(n3−n1))+1)*Theta_Modulator+C_3   (Equation 4).

According to some example embodiments, Theta_Stator may be determined from the position Theta_Shaft1 of Shaft1 connected to the modulator 390 having gear ratio Ratio_Shaft1, and also from the position Theta_Shaft2 of Shaft2 connected to the inner rotor 380 having gear ratio Ratio_Shaft2, according to the following equation:

Theta_Stator=−(n1/(n3−n1))*Ratio_Shaft2*Theta_Shaft2+((n3/(n3−n1))+1)*Theta_Ratio_Shaft2*Theta_Shaft2+C_3   (Equation 5).

In some example embodiments in which the mechanical connections include periodical (repeating) decimal fractions, the equations may be multiplied by a denominator of that ratio. Simplifying equations such as Equation 1, Equation 2, Equation 3, Equation 4, or Equation 5 by dividing by common factors may be beneficial.

According to some example embodiments, each of, or at least one of, Ratio_Shaft1 and Ratio_Shaft2 may be considered constants; however, example embodiments are not limited thereto. Furthermore, according to some example embodiments, each of, or at least one of, Theta_Shaft1 and Theta_Shaft2 may be considered variables; however, example embodiments are not limited thereto.

Figure 7:
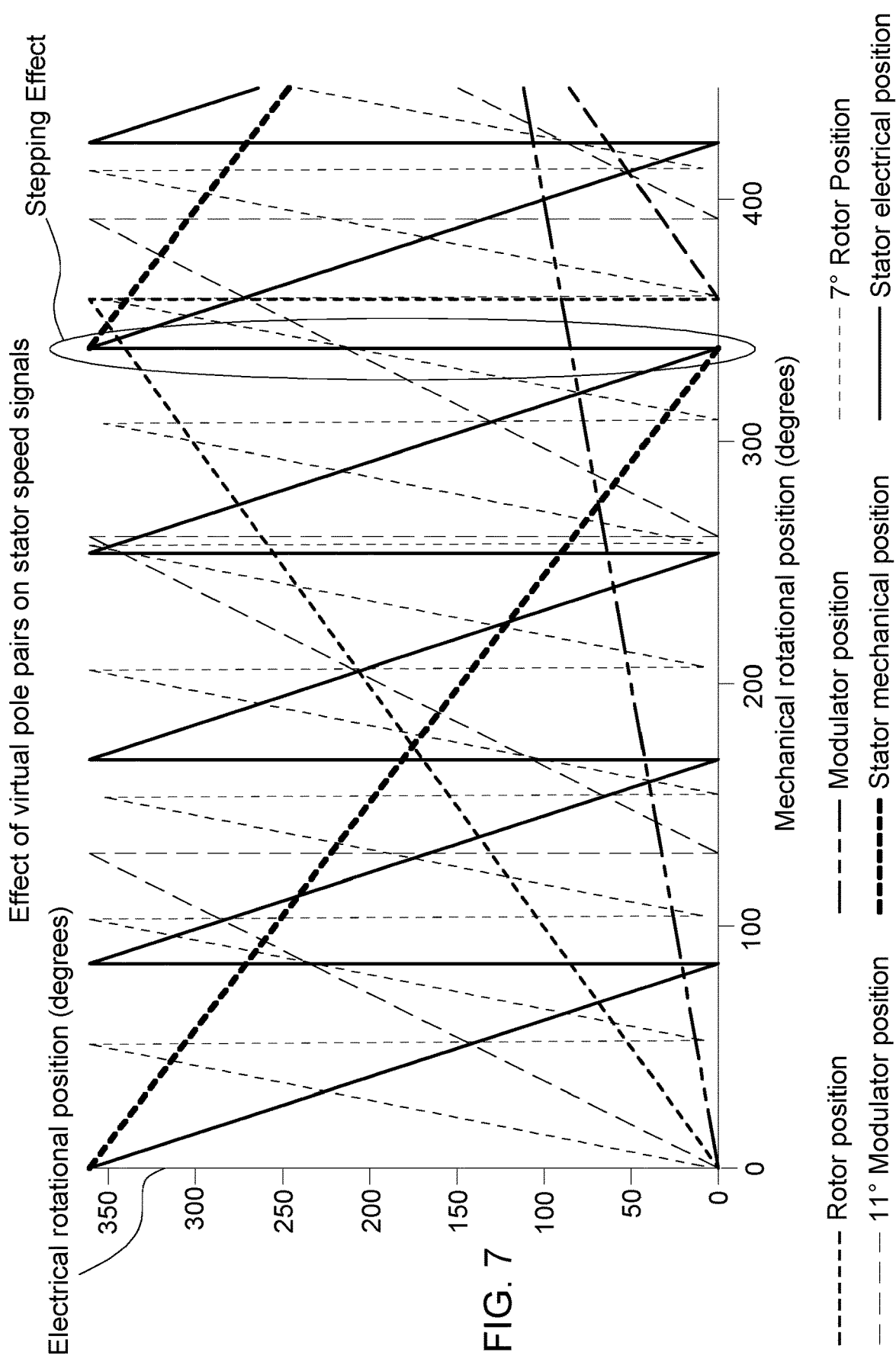

FIG. 7 illustrates a relation between mechanical and electrical rotation positions of the dual rotor electrical machine 310, according to some example embodiments.

In FIG. 7, the stator positions may be determined according to example embodiments described above.

As illustrated in FIG. 7, the stator electrical position at 360 degrees does not have the same abnormal Stepping Effect as is present in FIG. 1. For example, the electromagnetic field of the stator 330 above may be aligned with the electromagnetic fields of the inner rotor 380 and/or the modulator 390.

Figure 8:
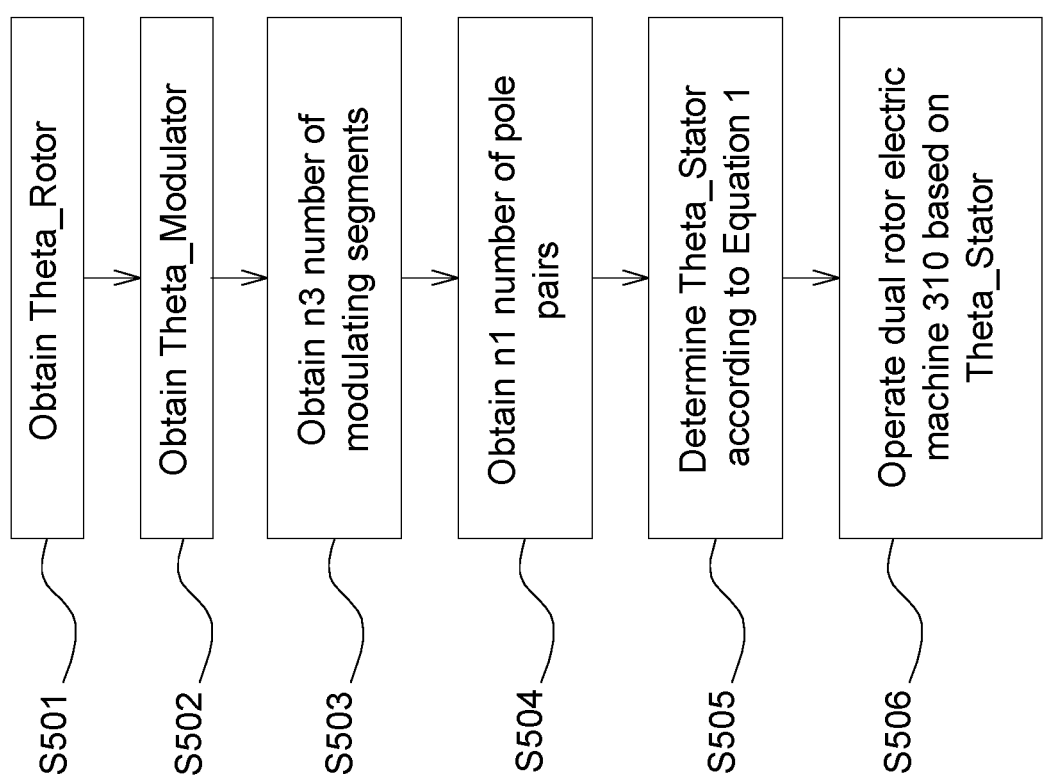

FIG. 8 illustrates a method of operating a dual rotor electrical machine 310 according to some example embodiments.

Initially in step S501, the position Theta_Rotor may be obtained. For example, the position Theta_Rotor may be obtained based on a first position resolver.

In step S502, the position Theta_Modulator may be obtained. For example, the position Theta_Modulator may be obtained based on a second position resolver.

In step S503, the number n3 of modulating segments may be obtained. This number n3 may be fixed within any given dual rotor electrical machine 310; however, example embodiments are not limited thereto.

In step S504, the number n1 of pole pairs in the inner rotor 380 may be obtained. This number n1 may be fixed within any given dual rotor electrical machine 310; however, example embodiments are not limited thereto.

In step S505, the virtual field position Theta_Stator may be determined. For example, the virtual field position Theta_Stator may be determined based on equation 1.

In step S506, the dual rotor electrical machine 310 may be operated based on the determined Theta_Stator. For example, at least one of a current command, a voltage command, or a torque command applied to the dual rotor electrical machine 310 may be based on the determined Theta_Stator.

By operating the dual rotor electrical machine 310 based on the determined Theta_Stator, a stepping effect may be reduced or eliminated, thus simplifying operation of the dual rotor electrical machine 310.

Although FIG. 8 illustrates operations presented in order, no order is meant to be implied by the operations in FIG. 8. For example, the obtaining of Theta_Modulator may be done before, or at the same time as, the obtaining of Theta_Rotor. Furthermore, the obtaining of the number of modeling segments n3 and/or the number of permanent magnet pole pairs n1 may be done before, or at the same time as, or later than, the obtaining of either or both of Theta_Modulator and/or of Theta_Rotor.

Figure 9A:
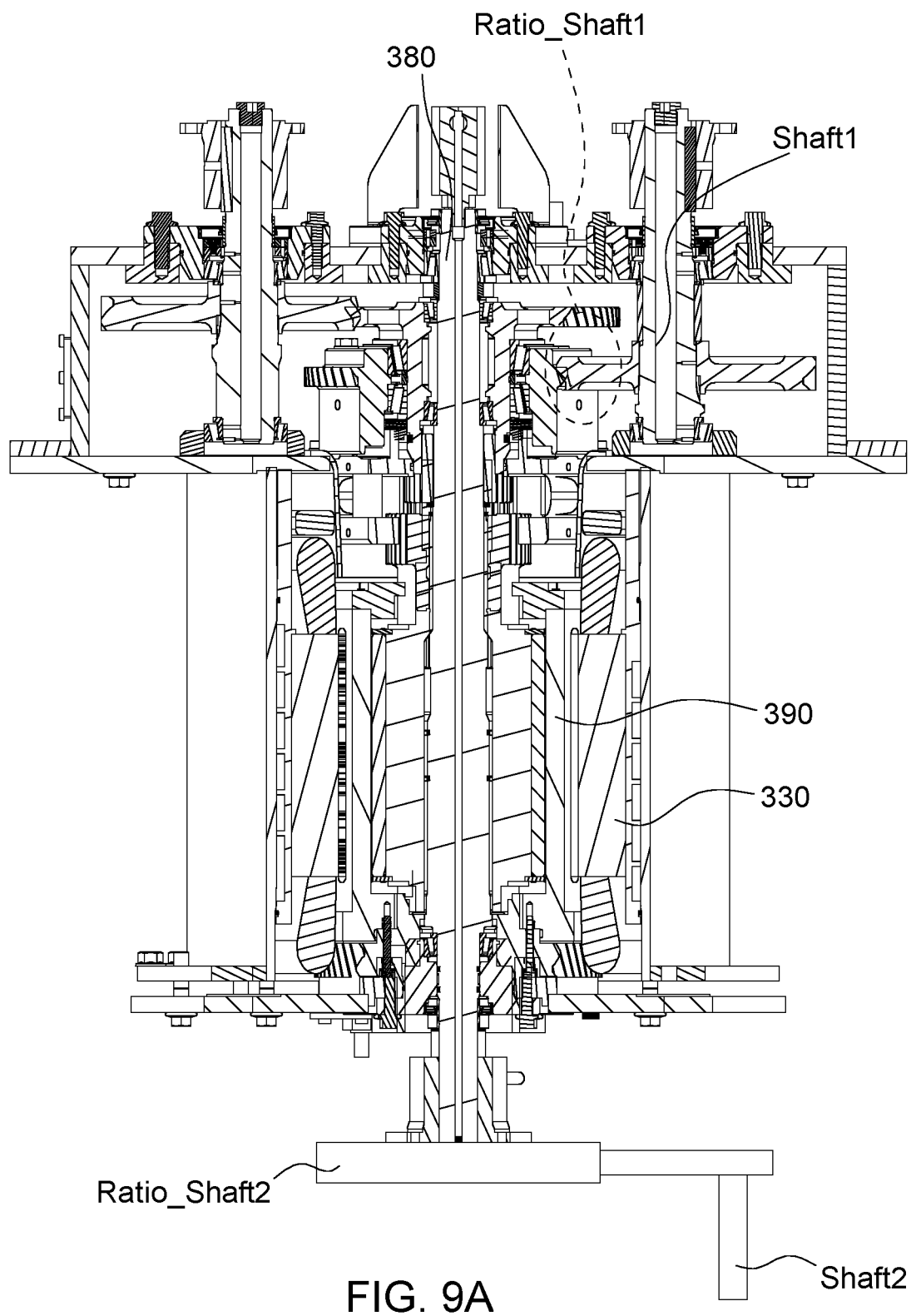
Figure 9B:
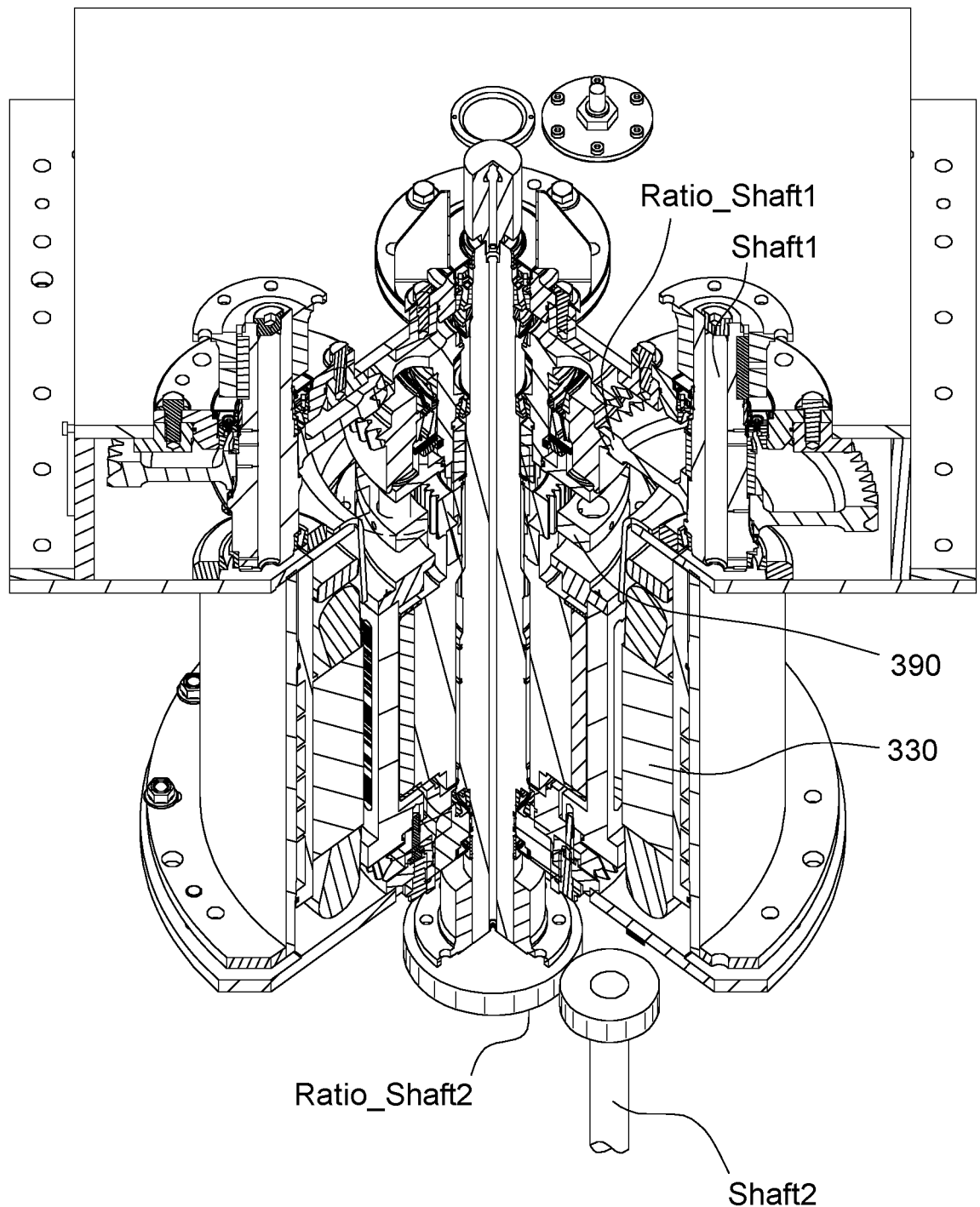

FIGS. 9a and 9b are alternate views of the dual rotor machine of FIGS. 6a and 6b, according to some example embodiments.

Referring to FIGS. 9a and 9b, a dual rotor electric machine 310 may be connected to a first shaft Shaft1 and to a second shaft Shaft2, and may include stator 330, the inner rotor 380, and the modulator 390.

The first shaft Shaft1 may be connected to the modulator 390. There may be a ratio RatioShaft1 of gears between the first shaft Shaft1 and the modulator 390. The second shaft Shaft2 may be connected to the inner rotor 380. There may be a ratio RatioShaft2 of gears (not illustrated) between the second shaft Shaft2 and the inner rotor 380.

Using the above methods and apparatuses to generate, expand, rearrange and/or simplify the stated equations, the dual rotor electrical machine suddenly may be operated like a single rotor permanent magnet synchronous machine, including, but not limited to be, at least one of speed mode operation, torque mode operation, Id/Iq lookup tables, field weakening operation, or position offset calibration.

Example embodiments being thus described, it will be obvious that the same may be varied in many ways. Such variations are not to be regarded as a departure from the spirit and scope of example embodiments, and all such modifications as would be obvious to one of ordinary skill in the art are intended to be included within the scope of the claims.

What is claimed is:

1. A system comprising:
   a dual rotor electrical machine including,
      a stator,
      an inner rotor including a first number of permanent magnet pole pairs,
      a modulator including a second number of modulating segments, and
      a first shaft connected to the modulator, the first shaft having a first shaft angular position; and
   a controller configured to execute non-transitory machine readable instructions that, when executed by the controller, cause the system to determine a virtual position of an electromagnetic field of the stator based on the first shaft angular position, a first gear ration, and a weighted sum of an angular position of the inner rotor and an angular position of the modulator, wherein
      weights in the weighted sum are based on the first number and the second number, and
      the first gear ratio is a ratio of a number of gears on the first shaft to a number of gears on the modulator.

2. The system of claim 1, wherein the controller is configured to execute machine readable instructions to control the dual rotor electrical machine based on the determined virtual position of the electromagnetic field of the stator.

3. The system of claim 1, wherein the controller is configured execute machine readable instructions to synchronize the electromagnetic field of the stator with an electromagnetic field associated with the rotor and the modulator.

4. The system of claim 1, wherein the controller is configured to execute machine readable instructions to operate the dual rotor electrical machine according to at least one of a speed mode or a torque mode.

5. The system of claim 1, wherein the dual rotor electrical machine is configured to operate as at least one of a motor or a generator.

6. The system of claim 1, further comprising:
   a first position resolver, the first position resolver configured to obtain the angular position of the inner rotor, and configured to provide the angular position to the controller.

7. The system of claim 1, further comprising:
   a second position resolver, the second position resolver configured to obtain the angular position of the modulator, and configured to provide the angular position of the modulator to the controller.

8. The system of claim 1, wherein the controller is configured to execute machine readable instructions to determine the virtual position as, $$\text{Theta\_Stator} = -(n1/(n3-n1))*\text{Theta\_Rotor} + ((n3/(n3-n1))+1)*\text{Ratio\_Shaft1}*\text{Theta\_Shaft1} + C\_3,$$

where Theta_Shaft1 is the first shaft angular position, Ratio_Shaft1 is the first gear ratio, Theta_Stator is the virtual position, Theta_Rotor is the angular position of the inner rotor, n1 is the first number of permanent magnet pole pairs, n3 is the second number of modulating segments, and C_3 is a position offset.

9. The system of claim 1, further comprising:
   a second shaft connected to the inner rotor, the second shaft having a second shaft angular position, with a second gear ratio being a ratio of a number of gears on the second shaft to a number of gears on the inner rotor, wherein
   the controller is configured to execute machine readable instructions to determine the virtual position based on the second shaft angular position and the second gear ratio.

10. The system of claim 9, wherein the controller is configured to determine the virtual position as, $$\text{Theta\_Stator} = -(n1/(n3-n1))* \\ \text{Ratio\_Shaft2}*\text{Theta\_Shaft2} + ((n3/(n3-n1))+1)* \\ \text{Theta\_Modulator} + C\_3,$$

where Theta_Shaft1 is the second shaft angular position, Ratio_Shaft1 is the second gear ratio, Theta_Stator is the virtual position, Theta_Modulator is the angular position of the modulator, n1 is the first number of permanent magnet pole pairs, n3 is the second number of modulating segments, and C_3 is a position offset.

11. The system of claim 1, further comprising:
   a first shaft connected to the modulator, the first shaft having a first shaft angular position with a first gear ratio being a ratio of a number of gears on the first shaft to a number of gears on the modulator; and
   a second shaft connected to the inner rotor, the second shaft having a second shaft angular position with a second gear ratio being a ratio of a number of gears on the second shaft to a number of gears on the inner rotor, wherein
   the controller is configured to execute machine readable instructions to determine the virtual position based on the first shaft angular position, the first gear ratio, the second shaft angular position, and the second gear ratio.

12. The system of claim 11, wherein the controller is configured to execute machine readable instructions to determine the virtual position as, $$\text{Theta\_Stator} = -(n1/(n3-n1))* \\ \text{Ratio\_Shaft2}*\text{Theta\_Shaft2} + ((n3/(n3-n1))+1)* \\ \text{Theta\_Ratio\_Shaft2}*\text{Theta\_Shaft2} + C\_3,$$

where Theta_Shaft1 is the first shaft angular position, Ratio_Shaft1 is the first gear ratio, Theta_Shaft2 is the second shaft angular position, Ratio_Shaft1 is the second gear ratio, Theta_Stator is the virtual position, n1 is the first number of permanent magnet pole pairs, n3 is the second number of modulating segments, and C_3 is a position offset.

13. The system of claim 1, wherein the controller is configured to execute non-transitory machine readable instructions that, when executed by the controller, cause the system to determine the virtual position of the electromagnetic field of the stator based on a position offset, wherein at least one of a position offset calibration run at startup of the dual rotor electrical machine determines the position offset, a factory determines the position offset, or a dealer determines the position offset.

14. A system comprising:
a dual rotor electrical machine including,
 a stator,
 an inner rotor including a first number of permanent magnet pole pairs, and
 a modulator including a second number of modulating segments; and
a controller configured to execute non-transitory machine readable instructions that, when executed by the controller, cause the system to determine a virtual position of an electromagnetic field of the stator based on a weighted sum of an angular position of the inner rotor and an angular position of the modulator, wherein weights in the weighted sum are based on the first number and the second number, wherein
the controller is configured to execute machine readable instructions to determine the virtual position as, $$\text{Theta\_Stator} = -(n1/(n3-n1))*\text{Theta\_Rotor} + ((n1/(n3-n1))+1)*\text{Theta\_Modulator} + C\_3,$$

where Theta_Stator is the virtual position, Theta_Rotor is the angular position of the inner rotor, Theta_Modulator is the angular position of the modulator, n1 is the first number of permanent magnet pole pairs, n3 is the second number of modulating segments, and C_3 is a position offset.

15. The system of claim 14, wherein C_3 is a value between 0 degrees and 360 degrees.

16. The system of claim 14, wherein at least one of a position offset calibration run at startup of the dual rotor electrical machine determines C_3, factory determine C_3, or a dealer determines C_3.

17. A method for operating a dual rotor electrical machine, the dual rotor electrical machine including a stator, an inner rotor including a first number of permanent magnet pole pairs, a modulator including a second number of modulating segments and corresponding modulating rings, and a first shaft connected to the modulator, the method comprising:

obtaining a first angular position of the inner rotor;
obtaining a second angular position of the modulator;
obtaining a first shaft angular position of the first shaft; and
determining a virtual position of an electromagnetic field of the stator, the virtual position based on the first shaft angular position, a first gear ratio, and a weighted sum of the first angular position and the second angular position, wherein
 weights in the weighted sum are based on the first number and the second number, and
 the first gear ratio is a ratio of a number of gears on the first shaft to a number of gears on the modulator.

18. The method of claim 17, further comprising:
controlling the dual rotor electrical machine based on the determined virtual position of the electromagnetic field of the stator.

19. A non-transitory computer readable medium, when executed by a controller in a system including a dual rotor electrical machine having a stator, an inner rotor including a first number of permanent magnet pole pairs, a modulator including a second number of modulating segments and corresponding modulating rings, and a first shaft connected to the modulator, is configured to cause the system to
obtain a first angular position of the inner rotor;
obtain a second angular position of the modulator;
obtain a first shaft angular position of the first shaft; and
determine a virtual position of an electromagnetic field of the stator, the virtual position based on the first shaft angular position, a first gear ratio, and weighted sum of the first angular position and the second angular position, wherein
 weights in the weighted sum are based on the first number and the second number, and
 the first gear ratio is a ratio of a number of gears on the first shaft to a number of gears on the modulator.

20. The non-transitory computer readable medium of claim 19, wherein the non-transitory computer readable medium, when executed by the controller, is configured to cause the system to,
control the dual rotor electrical machine based on the virtual position.

* * * * *